United States Patent [19]

Otaka

[11] Patent Number: 5,796,286

[45] Date of Patent: Aug. 18, 1998

[54] ATTENUATION CIRCUITRY USING GATE CURRENT CONTROL OF FET CONDUCTION TO VARY ATTENUATION

[75] Inventor: Shoji Otaka, Yokohama, Japan

[73] Assignee: Kabushiki Kaisha Toshiba, Kawasaki, Japan

[21] Appl. No.: 524,526

[22] Filed: Sep. 7, 1995

[30] Foreign Application Priority Data

Sep. 13, 1994 [JP] Japan ................................. 6-218972

[51] Int. Cl.⁶ ........................................................ H03K 5/08
[52] U.S. Cl. ............................................ 327/308; 327/307
[58] Field of Search ................................... 327/307, 308; 333/81 R

[56] References Cited

U.S. PATENT DOCUMENTS

| | | | |
|---|---|---|---|
| 4,061,970 | 12/1977 | Magneron | 325/2 |
| 4,138,637 | 2/1979 | Weinert | 323/74 |
| 4,438,415 | 3/1984 | Hopfer | 333/81 A |
| 4,654,610 | 3/1987 | Dasilva | 333/81 R |
| 4,996,504 | 2/1991 | Huber et al. | 333/81 R |
| 5,049,841 | 9/1991 | Cooper et al. | 333/81 R |
| 5,087,899 | 2/1992 | Lavper | 333/81 R |
| 5,281,928 | 1/1994 | Ravid et al. | 327/308 |
| 5,448,207 | 9/1995 | Kohama | 327/308 |
| 5,483,191 | 1/1996 | Blodgett | 327/432 |

OTHER PUBLICATIONS

Step Attenuator for Digital Mobile Telephone, M. Higuchi et al., Proceedings of the 1994 IEICE Spring Conference, C–117, 2–622.

Grob, "Basic Electronics", McGraw–Hill Book Company, New York, 1984, p. 194.

Sedra & Smith, 'Microelectronic Circuits', Saunders College Publishing, Philadelphia 1991, pp. 381–382.

Primary Examiner—Timothy P. Callahan
Assistant Examiner—Jeffrey Zweizig
Attorney, Agent, or Firm—Oblon, Spivak, McClelland, Maier & Neustadt, P.C.

[57] ABSTRACT

A GaAs MESFET that turns on and off to control the gain is connected to an attenuation circuit composed of a plurality of resistors connected between the input and output terminals and a reference potential terminal. By injecting a specific amount of current into the gate of the FET, the voltage between the gate and the source and drain is turned into the ON-state voltage of the Schottky junction determined by the injected current and the cross section of the FET, thereby turning on the FET. By applying a voltage lower than the threshold voltage between the gate and the source and drain of FET, the FET is turned on.

27 Claims, 5 Drawing Sheets

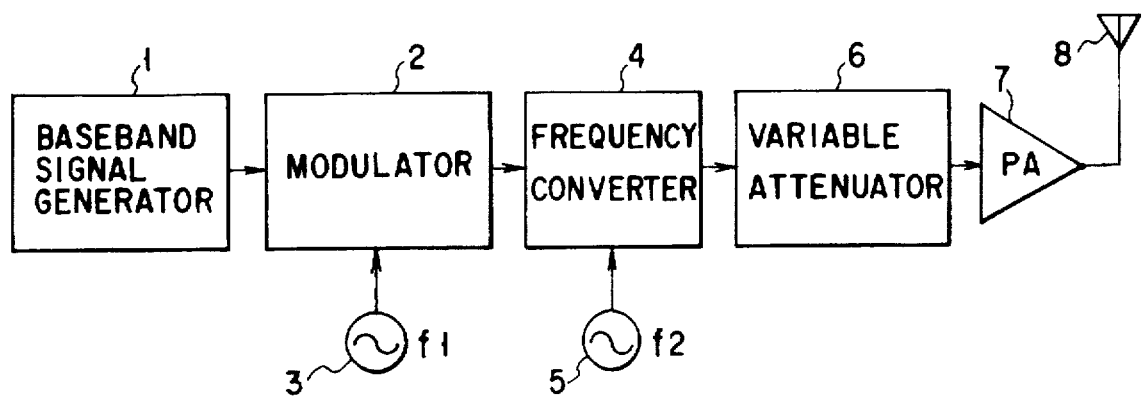
F I G. 1
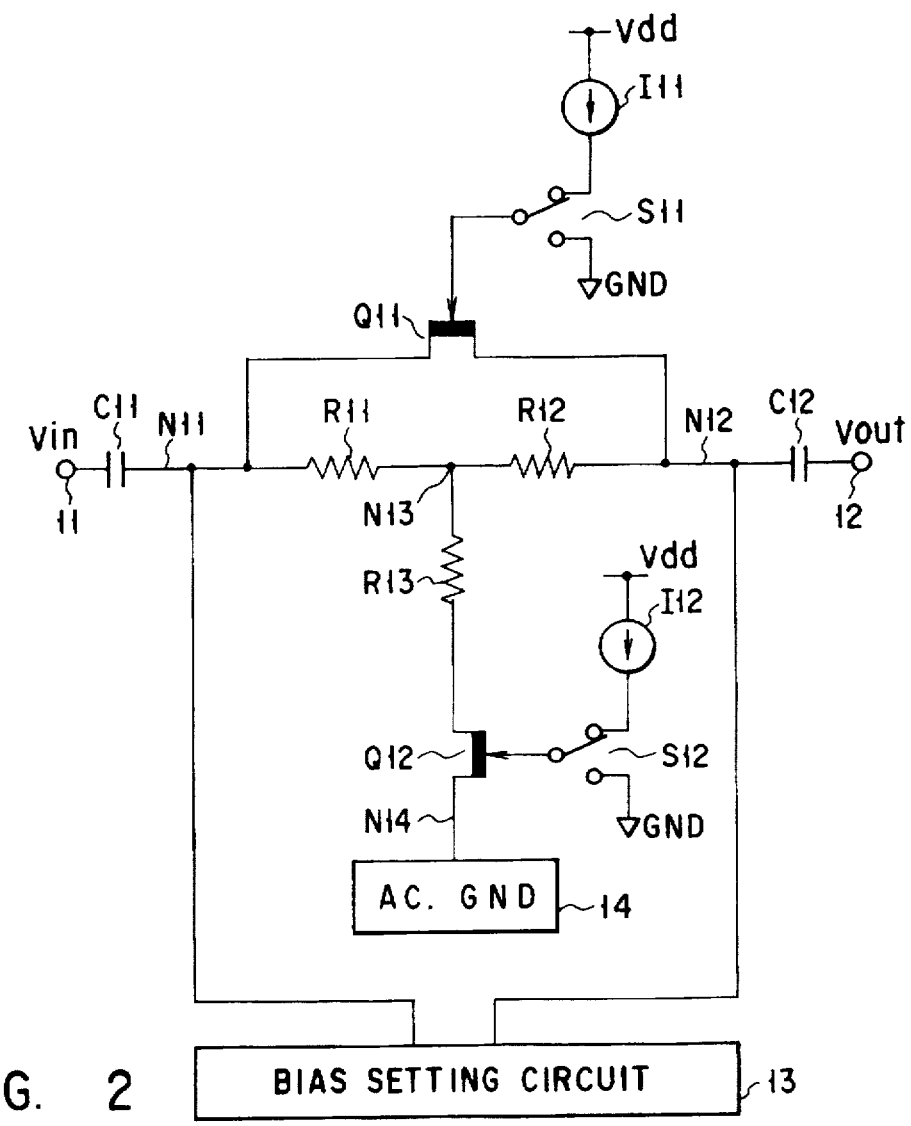
F I G. 2

FIG. 3A
FIG. 3B
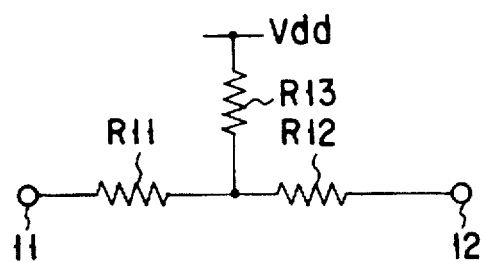
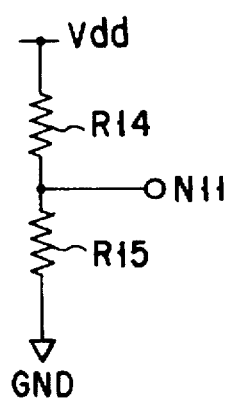
FIG. 4A
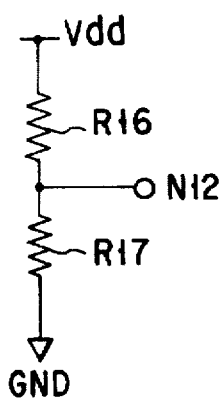
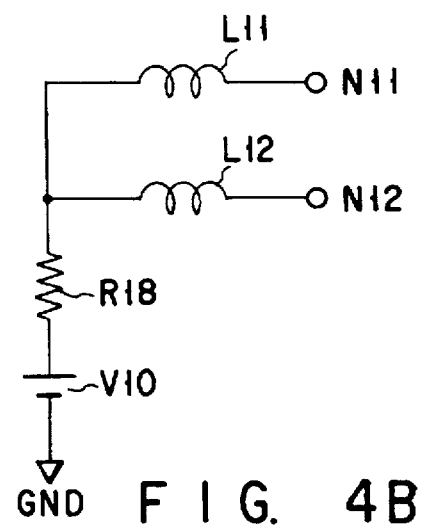
FIG. 4B
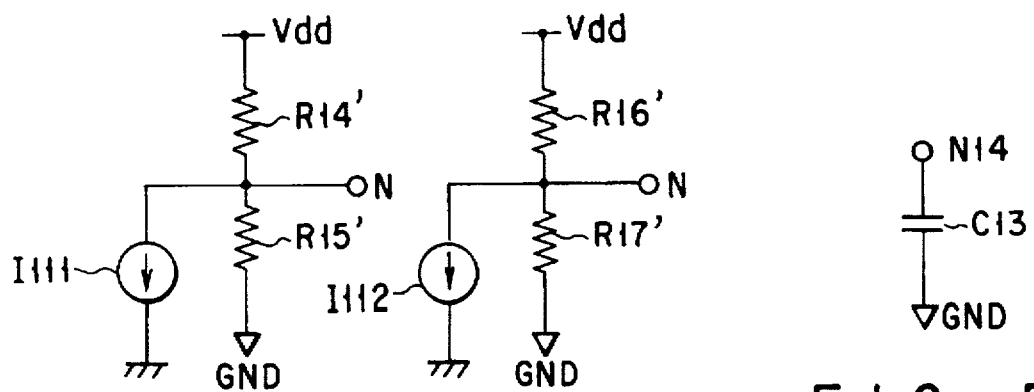
FIG. 4C
FIG. 5

ATTENUATION CIRCUITRY USING GATE CURRENT CONTROL OF FET CONDUCTION TO VARY ATTENUATION

BACKGROUND OF THE INVENTION

1. Field of the Invention

This invention relates to a variable attenuator for gain control of a high-frequency signal, and more particularly to a variable attenuator suitable for integrated circuit design most suited for a radio equipment.

2. Description of the Related Art

As information is getting personalized, demands for radio terminals such as portable telephones or automobile cellular phones are increasing. With the increasing number of subscribers to the portable telephone and automobile cellular phone systems, the frequencies handled by the radio terminals are getting higher to obtain a large number of radio channels. For example, in the case of PHS (personal handyphone system), a carrier frequency of 1.9 GHz is scheduled to be used in Japan.

Advances in device development, high-speed circuit techniques, and assembly techniques have made it possible to realize the miniaturization of radio terminals capable of handling high-speed signals. Radio terminals, however, are required to provide high-accuracy control of transmitting power so as to reduce the power consumption and lessen the effect of interference from another channel on the reception side. To develop such radio terminals, much higher techniques are being required.

In the transmission system in a conventional radio terminal, a baseband signal generator generates a baseband signal, such as a speech signal, which is inputted to a modulator. The modulator modulates a local signal f1 using the inputted baseband signal. The output of the modulator is frequency-converted by an up converter in the next stage into an RF signal using a local signal f2. The RF signal outputted from the up converter is gain-controlled at a variable attenuator and then is amplified to a specified transmission power by a power amplifier. Then, the amplified signal is output at an antenna in the form of radio waves.

In such a transmission system, the variable attenuator is used to control the gain to set the transmitting power output from the antenna at a desired value. Since the transmitting power is optimized by making highly accurate the gain control by the variable attenuator, the high-accuracy gain control is effective in reducing the power consumption of the transmission system, and even of the radio equipment itself. Therefore, in the case of a radio terminal using a battery as a power supply, a variable attenuator with a wide gain control range plays an important role.

Furthermore, in radio terminals, the individual component parts are required to operate from a single power supply. In a high-frequency radio equipment, measures must be taken to lower the impedance of the power supply to stabilize the circuit by, for example, preventing oscillation. To achieve this, not only a regulator and bypass capacitors to a ground terminal, but also use of thick wires for the power-supply lines in the mother board and module are necessary. Since use of a plurality of power supplies in the radio terminal increases the mounting area for the modules or mother board, it is strongly desired that the above-described individual elements in the transmission system should be operated from a single power supply.

Therefore, the advent of a variable attenuator with a wide gain control range, which operates in a single power supply and is suitable for integration has been wanted. Conventional variable attenuators have the problem that the signal is distorted, because the ON-state resistance of an FET used as a gain control switch changes with the input signal. When the threshold voltage of the FET is deeper so as to prevent the ON-state resistance from changing with the input signal, the squeezing of another circuit with a different threshold voltage into the same integrated circuit raises the problem that the complicated processes and the increased number of processes result in high cost. Furthermore, since conventional variable attenuators do not use an area where the ON-state resistance of the FET is low, when the gate width of the FET is made larger to make the ON-state resistance smaller, the parasitic capacitance becomes larger, causing the problem that a signal loss in the through mode increases.

SUMMARY OF THE INVENTION

An object of the present invention is to provide a variable attenuator where the ON-state resistance of an FET used as a gain control switch depends less on the input signal.

Another object of the present invention is to provide a variable attenuator which enables the ON-state resistance to be reduced without making larger than necessary the gate width of an FET used as a gain control switch.

According to the present invention, a variable attenuator can be provided which uses a junction FET, such as a GaAs MESFET or a p-n junction FET, as a gain control switch and which, when turning on the switch, places the voltage between the gate and the source or the gate and the drain at the ON-state voltage at the Schottky junction or p-n junction determined by the constantly injected current and the cross section of the FET, when turning off the switch, supplies a voltage lower than the threshold voltage between the gate and the source and drain.

Specifically, a variable attenuator according to the present invention comprises: an attenuation circuit composed of a plurality of resistors connected between an input terminal, an output terminal and a reference potential terminal; a junction FET which is connected to the attenuation circuit and which turns on and off to control the gain of the attenuation circuit; and a control circuit that provides on and off control of the junction FET, wherein the control circuit brings the FET into an on state by injecting a specific amount of current into the gate of the junction FET and brings the FET into an off state by applying a voltage lower than the threshold voltage between the gate and the source and drain of the FET.

As described above, with the present invention, by injecting a specific amount of current into the gate when a junction FET constituting a gain control switch is turned on, the voltage between the gate and both of the source and drain become the ON-state voltage at the Schottky junction or p-n junction determined by the current constantly injected into the gate and the cross section of the FET and is held constant, regardless of the input, with the result that a change in the ON-state resistance due to the signal can be reduced.

By doing this way, the ON-state resistance can be made lower sufficiently without setting the threshold voltage of FET deeper, making it easy to integrate the variable attenuator with another circuit.

Furthermore, since the ON-state voltage between the gate and the source or the gate and the drain in the FET can be made higher, the ON-state resistance can be made lower without making the gate width larger, reducing a signal loss due to a parasitic capacitance in the FET.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram of the transmission system in a radio equipment;

FIG. 2 is a circuit diagram of an embodiment of a variable attenuator according to the present invention;

FIGS. 3A and 3B are equivalent circuits of the variable attenuator of FIG. 2 in the through mode and the attenuation mode, respectively;

FIGS. 4A to 4C show circuit diagrams of bias setting circuits used in the variable attenuator according to an embodiment of the present invention;

FIG. 5 shows a circuit diagram of an AC ground circuit used in the variable attenuator according to the present invention;

DESCRIPTION OF THE PREFERRED EMBODIMENTS

Figure 6:
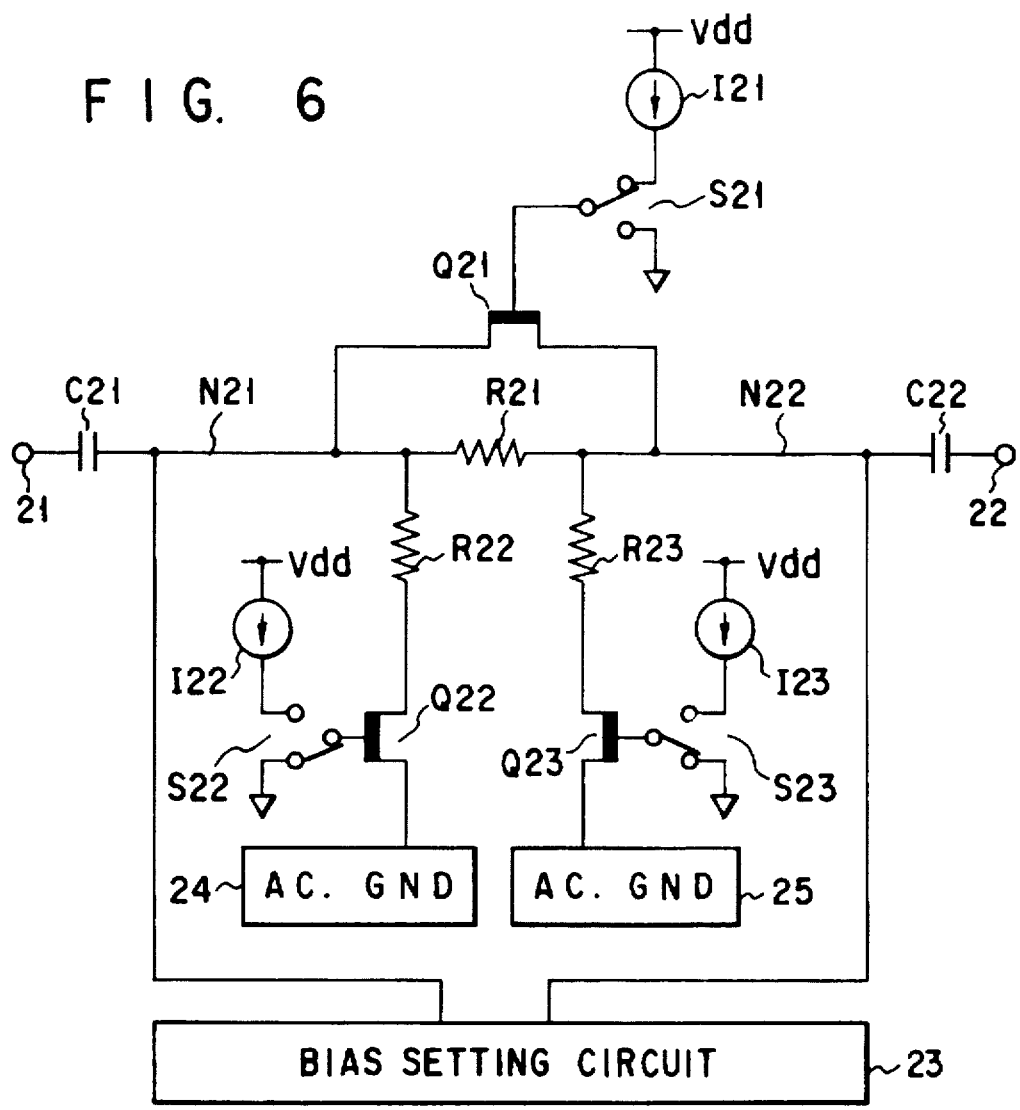
FIG. 6 shows a variable attenuator according to another embodiment of the present invention.

FIG. 1 shows the transmission system in a radio equipment using a variable attenuator. In the figure, a baseband signal generator 1 generates a baseband signal, such as a speech signal, which is then inputted to a modulator 2. The modulator 2 modulates a local signal f1 from a local oscillator 3 on the basis of the inputted baseband signal. The output signal of the modulator 2 is frequency-converted by a frequency converter 4 in the next stage into an RF signal using a local signal of frequency f2 from a local oscillator 5. After the RF signal outputted from the frequency converter 4 is gain-controlled by a variable attenuator 6, it is amplified by a power amplifier (PA) 7 to a specific transmission level. The amplified signal is outputted at an antenna 8 in the form of radio waves.

FIG. 2 is a circuit diagram of the variable attenuator 6 using a T-type attenuator in the above transmission system. In the figure, between an input terminal 11 and an output terminal 12, a capacitor C11, a resistor R11, a resistor R12, and a capacitor 12 are connected in series. One end of a resistor R13 is connected to the connection point of the resistor R11 and the resistor R12, or node N13. The capacitors C11 and C12 are AC coupling capacitors. The resistors R11 to R13 constitute a T-type attenuator.

The nodes N11, N12 at both ends of the series circuit of the resistors R11, R12 are connected to the source and drain of FET Q11 and to a bias setting circuit 13 as well. The gate of FET Q11 is connected to the common terminal of a switch S11. One terminal of the switch S11 is connected to a positive power-supply terminal Vdd via a constant-current source I11 and the other terminal is connected to a ground terminal GND.

On the other hand, the other end of the resistor R13 is connected to the source of FET Q12, whose drain is connected to an AC ground circuit 14. The gate of FET Q12 is connected to the common terminal of switch S12. One terminal of the switch S12 is connected to a positive power-supply terminal Vdd via a constant-current source I12 and the other terminal is connected to a ground terminal GND.

Hereinafter, the operation of the present embodiment will be explained. It is assumed that the capacitance of capacitors C11, C12 is infinite and the switches S11, S12 are controlled by control signals (not shown) so as to operate complimentarily. Furthermore, to simplify explanation, the DC potential applied for the bias setting circuit 13 is assumed to be Vdd/2.

When the control signals connect the switch S11 to the current source I11 and the switch S12 to the ground terminal GND, FET Q11 turns on and FET 12 turns off. This state corresponds to the equivalent circuit in the through mode shown in FIG. 3A. In this case, because the current from the current source I11 is inputted to the gate of FET Q11, the potential of the gate is higher than that of the source and drain of FET Q11 by the ON-state voltage at the Schottky junction (Von, stk). Therefore, as seen from equation (1), the ON-state resistance of FET Q11 is lower than when Vgs=0 [V] in the case of the conventional switch:

$$Ron = \partial Vds/\partial Id \approx 1/\{K(Vgs-V_T)\} \qquad (1)$$

where Ron is the ON-state resistance, Vds is the drain-source voltage, Id is the drain current, K is a constant proportional to W/L (W: the gate width, L: the gate length) of FET, $V_T$ is the threshold voltage, and Vgs is the gate-source voltage (in this case, the same as the gate-drain voltage).

In this state, when an input signal (an AC voltage of Vin) is supplied to the input terminal 11, the signal is transmitted to N11 and N12. At this time, since the constant-current source I1 supplies a constant current to the gate of FET Q11, the gate is always kept at a higher potential than the nodes N11, N12 serving as the source and drain, by the Schottky ON-state voltage Von, stk (Vdd/2+Von, stk+Vin). In other words, the gate of FET Q11 undergoes the same voltage change as that in the signal. Therefore, the ON-state resistance of FET Q11 can always be kept constant, regardless of the input signal. Here, when the output of the bias setting circuit 13 is Vdd/2, the power-supply voltage Vdd at which the operation is possible has the following condition:

$$Vdd/2 > Von, stk+Vin \qquad (2)$$

On the other hand, when according to the control signals, the switch S11 is connected to the ground terminal GND side and the switch S12 is connected to the current source I12 side, FET Q11 is off and FET Q12 is on. This state corresponds to the equivalent circuit of the T-type attenuator shown in FIG. 3B. At this time, because a current from the current source I12 is inputted to the gate of FET Q12, the potential of the gate is higher than that of the source and drain by the Schottky ON-state voltage (Von, stk), and the drain of FET Q12 is grounded in an alternating-current manner by an AC ground circuit 14. This prevents the source and drain from being influenced by a change in the input signal, placing the gate of FET Q12 at (Vdd/2+Von, stk), with the result that a constant potential is kept.

As explained above, because the ON-state voltage of FET Q11 and FET Q12 is always constant, regardless of the signal, in the variable attenuator of the present embodiment, the dependence of the ON-state resistance on the input signal can be reduced.

Furthermore, the variable attenuator of the embodiment has the following advantages.

First, the ON-state resistance of FET Q11 and FET Q12 is expressed as $1/\{K(Von, stk-V_T)\}$ using equation (1). When the dimensions of FETs (especially the gate width) are made the same, the ON-state resistance can be made lower than the ON-state resistance of FET in a conventional variable attenuator by the amount expressed by the following equation:

$$R, \text{MERIT} = \frac{Ron(\text{proposed})}{Ron(\text{conventional})} \quad (3)$$
$$= \frac{-V_T}{(Von, stk - V_T)}$$

For example, when a variable attenuator is designed for $V_T=-1$ [V] by a conventional scheme, if Von, stk is 0.6 [V], R, MERIT will be 0.625, reducing the ON-state resistance about 40%. When viewed from a different point of view, to realize the same ON-state resistance, the gate width (channel width) of FET can be made smaller than the conventional one by the amount expressed by equation (3). This is important especially when a high-speed signal is attenuated. The reason for this is that when the gate width is made larger, a parasitic capacitance increases the more, and because of the parasitic capacitance, the input signal attenuates and appears at the output. Therefore, use of the configuration of the present embodiment can decrease the attenuation of the input signal due to the parasitic capacitance.

Second, since Vgs can be made higher even if the threshold voltage $V_T$ of FET Q11 and FET Q12 is not made much deeper, when the attenuator is integrated with another circuit, it is easy to design a desired attenuator even if the same threshold voltage as that used in another circuit is used. Therefore, it is not necessary to increase the number of processes to make the threshold voltage different from that of another circuit, resulting in a low manufacturing cost.

Furthermore, the circuit of the present embodiment has the advantage that it can operate even if the threshold voltage is positive (in the case of EFET).

The bias setting circuit 13 of FIG. 2 is constructed as shown in FIG. 4A. In the figure, the bias voltage is set by resistance division using the resistors R14, R15 and the resistors R16, R17 connected in series between Vdd and the ground terminal GND. Specifically, the connection point of the resistors R14, R15 is connected to node N11 of FIG. 2 and the connection point of the resistors R16, R17 is connected to node N12 of FIG. 2. In this case, the parallel resistance of the resistors R14, R15 and the resistors R16, R17 must be set at a value sufficiently larger than the input impedance of the attenuator. The reason is to prevent the input from attenuating due to these two parallel resistances. Furthermore, because a current from either the current source I11 or I12 flows through these parallel resistances, the product of the current value I of current sources I11, I12 and the parallel resistance R, I·R must be made smaller sufficiently than the power-supply voltage Vdd. Depending on the specification, the product of I·R may be set lower than about Vdd/10, for example. Because a current from either current source I11 or I12 flows through the two parallel resistances, the bias setting circuit has the advantage that the direct-current potential will not change if the currents of the current source I11 and I12 are set at the same value even if it is operated either in the attenuation mode (FET Q11: on, FET Q12: off) or in the through mode (FET Q11: off, FET Q12: on).

In a modification of the bias setting circuit as shown in FIG. 4B, one end of each of inductors L11, L12 is connected to a low-impedance bias circuit (here, composed of a voltage source V10 and a resistor R18). The other ends of the inductors L11, L12 are connected to node N11, N12 of FIG. 2, respectively. In this case, from the viewpoint of high frequency, since the two output terminals of the bias setting circuit 13 have a high impedance because of the inductors L11, L12, this isolates node N11 from node N12 and at the same time, short-circuits node N11 to node N12 in terms of direct current. As a result, the direct-current bias applied to node N11 and node N12 has the same potential. In FIG. 4B, too, as in FIG. 4A, the product of the direct-current internal impedance in the bias setting circuit 13 and the current I from the current sources I11, I12 must be smaller sufficiently than Vdd.

FIG. 4C shows another modification of the bias setting circuit. According to the circuit, current sources I111 and I112 are connected to nodes N11 and N12, respectively. The current value of each of the current sources I111 and I112 is set at one half the current value of the current sources I11 and I12. Therefore, the current of the current sources I11 and I12 is drawn to the current sources I111 and I112, so that it does not flows through the resisters R14', R15', R16' and R17'. Accordingly, the DC bias potential of the attenuator is determined by a ratio of the resistance of the resistors R14' to R15' or that of the resistors R16' to R17'.

The AC ground circuit 14 is composed of capacitor C13 as shown in FIG. 5. One end of the capacitor C13 is connected to the ground terminal GND (or the power-supply terminal Vdd) and its other end is connected to node N14, the drain of FET Q13 of FIG. 2. In this case, the impedance of the capacitor C13 must be set at a value sufficiently smaller than the resistance R13 of FIG. 2.

Although a concrete construction of the current sources I11, I12 of FIG. 2 is not shown, they may be constructed using a known DCFL circuit, a basic logic of GaAs MESFET, for example. Furthermore, by replacing the current sources I11, I12 with resistors, similar characteristics can be obtained.

Hereinafter, a π-type attenuator, a variable attenuator according to an embodiment of the present invention, will be explained. In FIG. 6, between an input terminal 21 and an output terminal 22, a capacitor C21 for AC coupling, a resistor R21, and a capacitor C22 for AC coupling are connected in series. One end of each of resistors R22 and R23 is connected to the connection point between the resistor R21 and the capacitor C21 and the connection point between the resistor R21 and the capacitor C22, respectively. In this case, the resistors R21 to R23 constitute a π-type attenuation circuit.

The nodes N21 and N22 are connected to the source and drain of FET Q21, respectively, and also connected to a bias setting circuit 23. The gate of FET Q21 is connected to the common terminal of switch S21. One terminal of switch S21 is connected to a positive power-supply terminal Vdd via a constant-current source I21 and the other terminal is connected to a ground terminal GND.

To the other ends of the resistors R22, R23, the drains of FET Q22 and FET Q23 are connected, respectively. The sources of FET Q22 and FET Q23 are connected to AC ground circuits 24, 25, respectively. The gates of FET Q22 and FET Q23 are connected to the common terminals of switches S22, S23, respectively. One terminal of each of switches S22, S23 is connected to a positive power-supply terminal Vdd via a constant-current source I22 or I23, respectively, and the other terminals are connected to a ground terminal GND.

Figure 7:
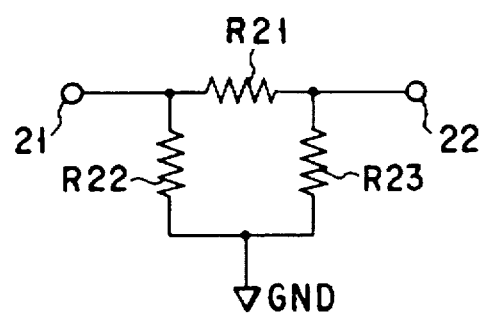
FIG. 7 shows an equivalent circuit of the variable attenuator of FIG. 6 in the attenuation mode.

Hereinafter, the operation of the present embodiment will be explained. First, in the attenuation mode, according to a control signal (not shown), FET Q21 is off and both of FET Q22 and FET Q23 are on. In this case, the embodiment operates as a π-type attenuator whose equivalent circuit is shown in FIG. 7. In the through mode, FET Q21 is on and both of FET Q22 and FET Q23 are off, and the embodiment operates in a conducting state. It goes without saying that the present embodiment also produces a similar effect to that of the embodiment shown in FIG. 2.

In order to prevent the direct current level from changing even if the operation mode is switched between the through mode and the attenuation mode similarly to the T-type attenuator, when the current sources I21, I22 and I23 are presumed to have current values i21, i22 and i23, the relationship of i22=i23=i21/2 may be confirmed.

In the above embodiments, a one-stage variable attenuator is used which can switch the gain between a value of 1 and a value smaller than 1 determined by the resistors constituting the attenuator. By cascade-connecting similar attenuators in stages, however, the number of variable steps of gain can be increased. If the number of stages of cascade connection is n and the gain at the individual stages in the attenuation mode is made different, the number of variable steps of gain can be made $2^n$ (n=integer).

Figure 8:
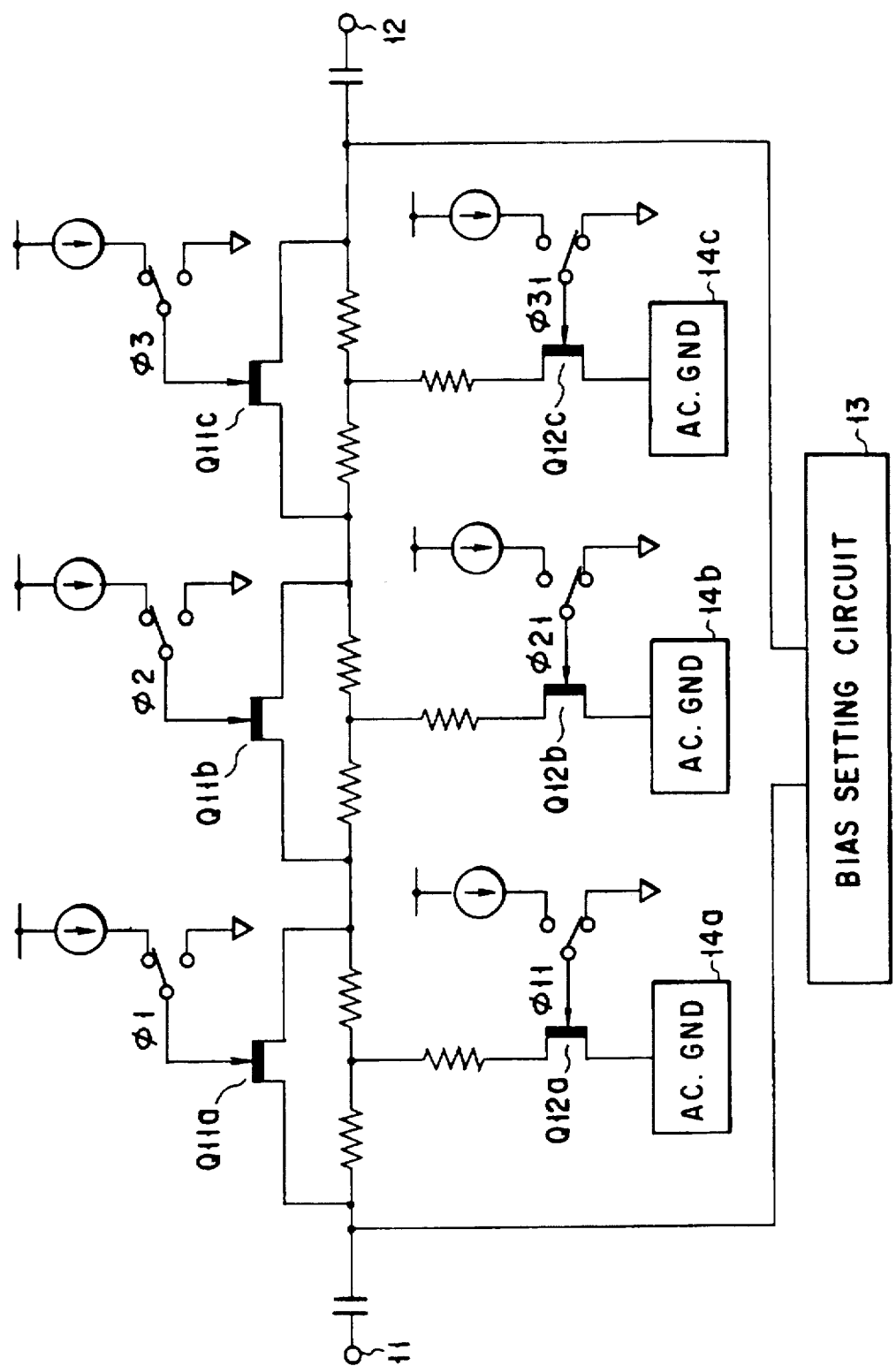
FIG. 8 shows a circuit diagram of a variable attenuator composed of three stages of variable attenuators of FIG. 2 cascade-connected.

FIG. 8 shows an embodiment where three T-type variable attenuators of FIG. 1 are cascade-connected into three stages. In the attenuators in the individual stages, the gates of FETs Q11a, Q11b, Q11c are supplied with control signals ø1, ø2, ø3, respectively. The gates of FETs Q12a, Q12b, Q12c are supplied with control signals ø1/, ø2/, ø3/ whose phase is opposite to that of ø1, ø2, ø3, respectively, thereby performing gain control. These control signals can be supplied by connecting the gates of the FETs to either the constant-current source or the ground terminal by means of switches, as with the embodiment of FIG. 1. While in FIG. 8, the individual stages are provided with separate AC ground circuits 14a, 14b, 14c, these stages may be provided with a common AC ground circuit.

Figure 9:
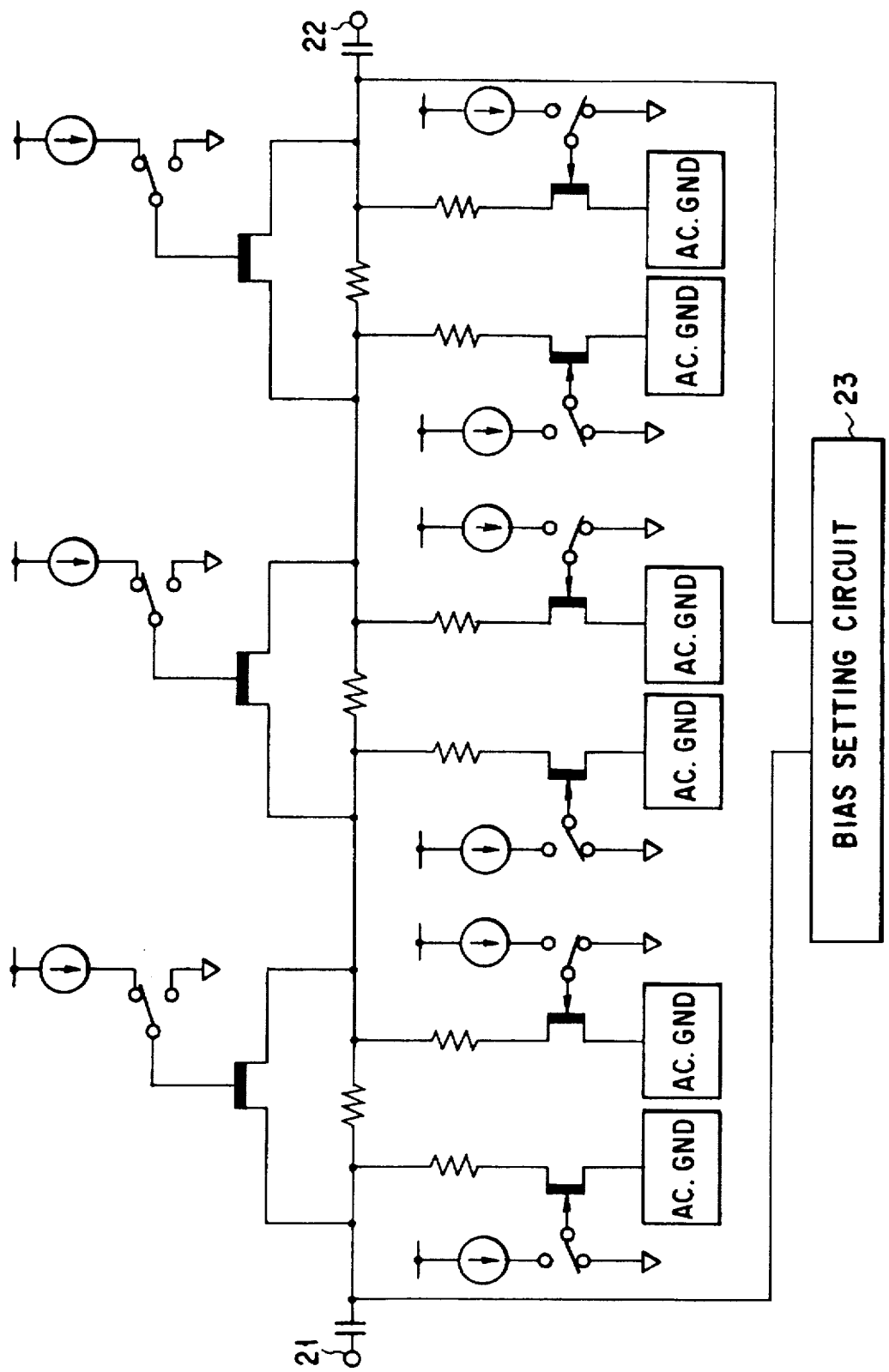
FIG. 9 shows a circuit diagram of a variable attenuator composed of three stages of variable attenuators of FIG. 6 cascade-connected.

FIG. 9 shows an embodiment where three π-type attenuators of FIG. 6 are cascade-connected into three stages. The operation is the same as that of the embodiment of FIG. 6, so that its explanation will not be given.

While in the above embodiments, a GaAs MESFET is used as a gain control switch, use of a p-n junction FET will produce a similar effect.

As explained above, with the present invention, a GaAs MESFET or a junction FET are used as a gain control switch and by injecting a specific amount of current into the gate when the FET is turned on, the voltage between the gate and the source and drain can be kept constant, regardless of the input signal, the dependence of the ON-state resistance on the input signal can be reduced. As a result, the distortion of the signal is reduced.

Furthermore, because it is not necessary to lower the threshold voltage to reduce the dependence of the ON-state resistance of FET on the input signal, when these circuits are squeezed into high integration, the threshold voltage of the circuit can be made equal to the threshold voltage of the circuits other than the variable attenuator, making it easy to integrate the variable attenuator with other circuits. As a result, it is possible to reduce the number of processes, helping cut manufacturing cost.

Furthermore, because the ON-state resistance can be made lower than that of conventional one without making the gate width of FET larger than necessary, it is possible to reduce a signal loss due to a parasitic capacitance in FET.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A variable attenuator comprising:
    an attenuation circuit including a plurality of resistors including first and second series connected resistors between an input terminal and an output terminal and having an intermediate junction and a third resistor having one terminal connected to said intermediate junction in a T-shaped configuration;
    a first junction field effect transistor connected between the other terminal of said third resistor and a reference terminal and having a first gate;
    a second junction field effect transistor which is connected in parallel with the series connected resistors;
    a bias setting circuit for applying a bias voltage higher than a ground potential to a second drain and a second source of said second field effect transistor; and
    a current controller including a constant-current source applying a voltage higher than the bias voltage to a second gate of said second field effect transistor to inject a constant current into the second gate and render the second field effect transistor in a conductive condition while said first field effect transistors is held non-conductive, said current controller including means for connecting the second gate to a ground terminal to render said second field effect transistor in a non-conductive condition while said first field effect transistor is held conductive.

2. A variable attenuator according to claim 1, wherein said bias setting circuit applies a bias voltage half a power supply voltage to the drain and the source.

3. A variable attenuator according to claim 1, further comprising an alternating-current grounding circuit connected between said first junction field effect transistor and said reference terminal and grounding said attenuation circuit in an alternating current manner.

4. A variable attenuator according to claim 1, wherein said bias setting circuit includes a DC-potential setting circuit setting a DC-potential of a first node between said input terminal and said attenuation circuit and a DC-potential of a second node between said output terminal and said attenuation circuit at a specific DC power-supply voltage potential as the bias voltage.

5. A variable attenuator according to claim 4, further comprising an alternating-current grounding circuit connected to said reference terminal and grounding said attenuation circuit in an alternating current manner.

6. A variable attenuator according to claim 3, wherein said third resistor is connected to said alternating-current grounding circuit via said first junction field effect transistor.

7. A variable attenuator according to claim 1, wherein said means included in said current controller includes a switching circuit connecting the second gate to the ground terminal and the first gate to said constant current source and vise versa.

8. A variable attenuator according to claim 1, wherein said means included in said current controller includes switching elements that connect the first gate and said second gate to said ground terminal and said constant-current source in a complementary manner.

9. A variable attenuator comprising:

a T-shaped attenuation circuit having a series resistor circuit including first and second resistors connected in series between an input terminal and an output terminal and a third resistor with a first terminal connected to a series node between said first and second resistors and a second terminal;

a first junction field effect transistor with a first source and a first drain connected to said input terminal and said output terminal, respectively, and a first gate;

an alternating current grounding circuit connecting said attenuation circuit to a ground terminal in an alternating current manner;

a second junction field effect transistor with a second source and a second drain connected to the second terminal of said third resistor and said alternating current grounding circuit, respectively, and a second gate;

a bias setting circuit for applying a bias voltage higher than a ground potential to the first drain and the first source; and a current controller including a current source applying a voltage higher than the bias voltage to said first gate to inject a specific amount of current into said first gate and bring said first junction field effect transistor into a conductive state while said second junction field effect transistor is non-conductive, said current controller including means for connecting the first gate to a ground terminal to render said first field effect transistor in a non-conductive condition while said second field effect transistor is held conductive.

10. A variable attenuator according to claim 9, wherein said bias setting circuit applies a bias voltage half a power supply voltage to the drain and the source.

11. A variable attenuator according to claim 9, said bias setting circuit includes a DC-potential setting circuit setting a DC-potential of a first node between said input terminal and said attenuation circuit and a DC-potential of a second node between said output terminal and said attenuation circuit at a specific DC power-supply voltage potential as the bias voltage.

12. A variable attenuator according to claim 11, wherein said DC-potential setting circuit includes two voltage-divider circuits having, respectively, third and fourth nodes connected to said first and second nodes, respectively, each of the voltage-divider circuits comprising a plurality of resistors connected in series between a DC power-supply terminal to which the DC power-supply voltage potential is applied and a ground terminal having a ground potential.

13. A variable attenuator circuit according to claim 12, wherein said means included in said current controller includes switch elements for selectively connecting one of the first and second gates to said current source and the other of the first and second gates to said ground terminal in a complimentary manner to inject the constant current to the gate connected to the current source, wherein said two voltage-divider circuits have a plurality of additional current sources connected to said third and fourth nodes, respectively.

14. A variable attenuator according to claim 11, wherein said DC-potential setting circuit includes a plurality of inductors connected to said first and second nodes, respectively, and a bias circuit connected to said first and second nodes through said inductors.

15. A variable attenuator according to claim 9, wherein said means included in said current controller includes switching elements selectively connecting one of said first and second gates to said constant-current source and the other one of said first and second gates to said ground terminal.

16. A variable attenuator according to claim 9, further comprising a first capacitor connected between said input terminal and said first resistor and a second capacitor connected between said output terminal and said second resistor.

17. A variable attenuator according to claim 9, wherein said current source comprises a first current source for supplying a first current to said first gate to control conduction of said first field effect transistor and a second current source for supplying a second current to said second gate to control conduction of said second field effect transistor, the first current having a current value equal to that of the second current.

18. A variable attenuator comprising:

a π-shaped attenuation circuit including a first resistor with first and second terminals connected to an input terminal and an output terminal, respectively, and second and third resistors having respective first terminals connected to the first and second terminals of said first resistor, respectively, and respective second terminals;

a first junction field effect transistor with a first source and a first drain connected to the first and second terminals of said first resistor, respectively, and a first gate;

a second junction field effect transistor with a second source and a second drain connected to the second terminal of a respective one of said second and third resistors and to a reference potential terminal, respectively, and a second gate;

a third junction field effect transistor with a third source and a third drain connected to the second terminal of the other of said second and third resistors and to said reference potential terminal, respectively, and a third gate;

a bias setting circuit for applying a bias voltage higher than a ground potential to the first drain and the first source; and a current controller including a constant-current source applying a voltage higher than the bias voltage to said first gate to inject a constant current into the first gate and render said first field effect transistor in a conductive condition while said second and third field effect transistors are non-conductive, said current controller including means for connecting the first gate to a ground terminal to render said first field effect transistor in a non-conductive condition while said second and third field effect transistors are held conductive.

19. A variable attenuator according to claim 18, wherein said bias setting circuit applies a bias voltage half a power supply voltage to the drain and the source.

20. A variable attenuator according to claim 18, further comprising an alternating current grounding circuit connected to said reference terminal.

21. A variable attenuator according to claim 18, wherein said bias setting circuit includes a DC-potential setting circuit setting a DC-potential of a second node between said input terminal and said attenuation circuit and a DC-potential of a second node between said output terminal and said attenuation circuit at a specific value between DC power-supply voltage and a ground potential.

22. A variable attenuator according to claim 21, further including an alternating-current grounding circuit connected to said reference terminal for grounding said attenuator circuit in an alternating-current manner.

23. A variable attenuator according to claim 18, wherein said means included in said current controller includes switching elements selectively connecting the first gate to either said constant-current source or to said ground terminal and the second and third gates as a pair to either of the constant current source or to the ground terminal.

24. A variable attenuator according to claim 23, further comprising a first capacitor connected between said input terminal and the first terminal of said first resistor and a second capacitor connected between said output terminal and the second terminal of said first resistor.

25. A variable attenuator according to claim 18, wherein said constant-current source comprises a first current source for supplying a first current to said first gate to control conduction of said first field effect transistor and a second current source for supplying a second current to both said second and third gates to control conduction of said second and third field effect transistors, the first current having a current value equal to that of the second current.

26. A variable attenuator device comprising:

plural stages of attenuators connected in series, each of said attenuators comprising, a π-shaped attenuation circuit including a first resistor with first and second terminals connected to an input terminal and an output terminal, respectively, and second and third resistors having respective first terminals connected to the first and second terminals of the first resistor respectively, and respective second terminals, a first junction field effect transistor with a first source and a first drain connected to the first and second terminals of said first resistor, respectively, and a first gate, a second junction field effect transistor with a second source and a second drain connected to the second terminal of a respective one of said second and third resistors and to a reference potential terminal, respectively, and a second gate, a third junction field effect transistor with a third source and a third drain connected to the second terminal of the other of said second and third resistors and to said reference potential terminal, respectively, and a third gate, a bias setting circuit for applying a bias voltage higher than a ground potential to the first drain and the first source, and a current controller including a constant-current source applying a voltage higher than the bias voltage to said first gate to inject a constant current into the first gate and render said first field effect transistor in a conductive condition while said second and third field effect transistors are non-conductive, said current controller including means for connecting the first gate to a ground terminal to render said first field effect transistor in a non-conductive condition while said second and third field effect transistors are held conductive.

27. A variable attenuator according to claim 26, wherein said bias setting circuit applies a bias voltage half a power supply voltage to the drain and the source.

* * * * *